United States Patent
Bathan et al.

(10) Patent No.: US 8,304,337 B2
(45) Date of Patent: Nov. 6, 2012

(54) INTEGRATED CIRCUIT PACKAGING SYSTEM WITH BOND WIRE PADS AND METHOD OF MANUFACTURE THEREOF

(75) Inventors: Henry Descalzo Bathan, Singapore (SG); Jairus Legaspi Pisigan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 316 days.

(21) Appl. No.: 12/637,746

(22) Filed: Dec. 14, 2009

(65) Prior Publication Data

US 2011/0140287 A1    Jun. 16, 2011

(51) Int. Cl.
*H01L 21/44* (2006.01)
*H01L 29/40* (2006.01)

(52) U.S. Cl. . 438/612; 257/784; 257/786; 257/E23.033; 438/616; 438/617

(58) Field of Classification Search ............. 438/612, 438/616, 617; 257/786, 784, E23.033
See application file for complete search history.

(56) References Cited

U.S. PATENT DOCUMENTS

| | | | | |
|---|---|---|---|---|
| 5,444,303 | A | * | 8/1995 | Greenwood et al. .......... 257/786 |
| 5,635,424 | A | | 6/1997 | Rostoker et al. |
| 2002/0093088 | A1 | * | 7/2002 | Wang ............................ 257/693 |
| 2008/0001273 | A1 | | 1/2008 | Park |

\* cited by examiner

*Primary Examiner* — Long Tran
(74) *Attorney, Agent, or Firm* — Ishimaru & Associates LLP; Mikio Ishimaru; Stanley M. Chang

(57) ABSTRACT

A method of manufacture of an integrated circuit packaging system includes: forming a device over a substrate including a bond wire pad row located between a perimeter of the substrate and the device; configuring the bond wire pad row to include three sided bond wire pads that horizontally overlap; and forming an interconnection between the device and the bond wire pad row.

20 Claims, 3 Drawing Sheets

INTEGRATED CIRCUIT PACKAGING SYSTEM WITH BOND WIRE PADS AND METHOD OF MANUFACTURE THEREOF

TECHNICAL FIELD

The present invention relates generally to an integrated circuit packaging system, and more particularly to an integrated circuit packaging system with improved input/output capability.

BACKGROUND ART

Integrated circuits and integrated circuit packaging systems can be found in a multitude of portable electronic devices, such as smart phones, pocket PCs, digital cameras, location-based devices, and other wireless products. Today's customers and electronics systems are demanding that these integrated circuit systems provide maximum functional integration of memory and logic within the smallest footprint, lowest profile, and lowest cost package available. Consequently, manufacturers are requiring an increasing number of input/output (I/O) leads to support the high level of functional integration of these mobile multimedia products.

Unfortunately, as the number of I/O leads increases, the interval between these leads must decrease in order to prevent the size of a semiconductor package from increasing. Furthermore, as the number of I/O leads increases, so do the number of wires required to interconnect these leads to the bond pads of the integrated circuits within these packaging systems. As a result, it can become quite difficult to create reliable connections between I/O leads and bonding pads. For example, common wire bonding problems at this technology node include difficult wire access, crossed wires, and small contact areas for the leads.

Thus, a need still remains for a reliable integrated circuit packaging system, method of fabrication, and device design, wherein the integrated circuit packaging system increases the number of I/O counts without increasing the complexity of wire bonding. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a device over a substrate including a bond wire pad row located between a perimeter of the substrate and the device; configuring the bond wire pad row to include three sided bond wire pads that horizontally overlap; and forming an interconnection between the device and the bond wire pad row.

The present invention provides an integrated circuit packaging system, including: a device over a substrate including a bond wire pad row located between a perimeter of the substrate and the device, the bond wire pad row configured to include three sided bond wire pads that horizontally overlap; and an interconnection between the device and the bond wire pad row.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
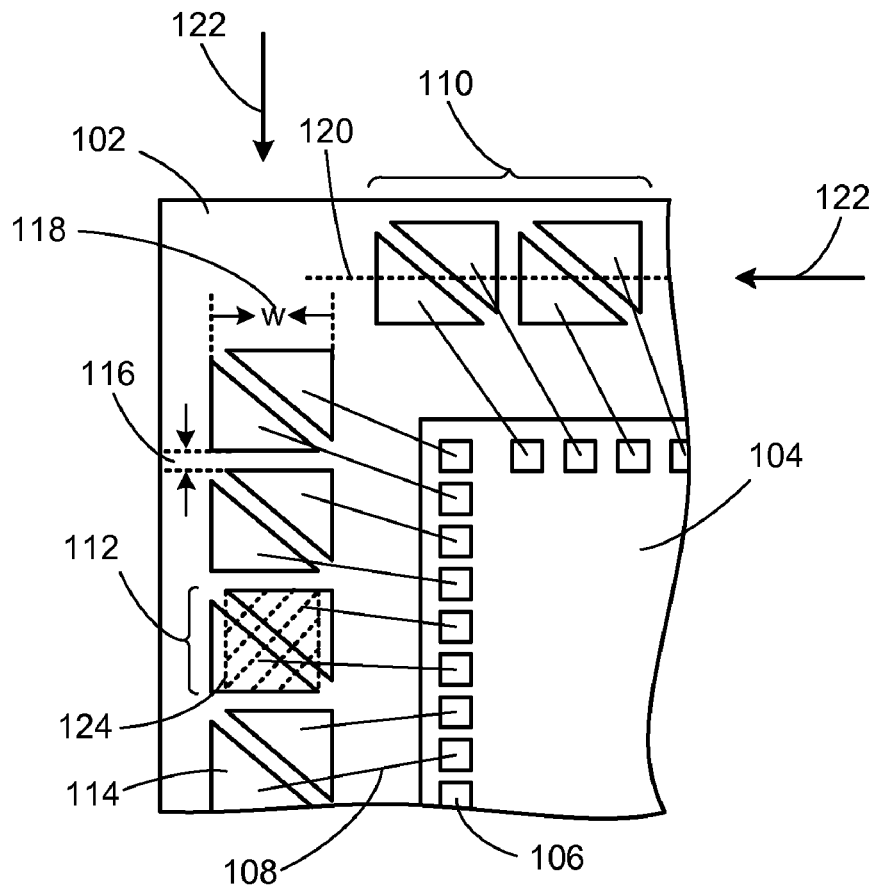
FIG. 1 is a partial top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, exposure, development, etching, cleaning, and/or removal of the material or photoresist as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "on" is used herein to mean there is direct contact among elements.

The terms "overlap" and "horizontally overlap" are used herein to mean when one element extends over or past and covers a part of an adjacent element when viewed along the horizontal plane of the substrate.

Objects described herein as being "adjacent to" each other may be in close proximity to each other, e.g., separated only by the minimum distance required by the current technology node, or in the same general region or area as each other, as appropriate for the context in which the phrase is used.

FIGS. 1-6, which follow, depict by way of example and not by limitation, exemplary embodiments for the formation of an integrated circuit packaging system and they are not to be construed as limiting. It is to be understood that a plurality of conventional processes that are well known within the art and not repeated herein, may precede or follow FIGS. 1-6. Moreover, it is to be understood that many modifications, additions, and/or omissions may be made to the below described processes and/or embodiments without departing from the scope of the claimed subject matter. For example, the below described processes and/or embodiments may include more, fewer, or other steps. Additionally, steps may be performed in any suitable order without departing from the scope of the present invention.

Moreover, it is to be appreciated that the integrated circuit packaging system of the present disclosure may include any number of stacked devices and/or packages, such as but not limited to, memory circuits, logic circuits, analog circuits, digital circuits, passive circuits, RF circuits, or a combination thereof, for example. Moreover, it is to be understood that the integrated circuit packaging system manufactured by the embodiments described herein can be used within processor components, memory components, logic components, digital components, analog components, mixed-signal components, power components, radio-frequency (RF) components, digital signal processor components, micro-electromechanical components, optical sensor components, or a combination thereof, in numerous configurations and arrangements as may be needed.

Furthermore, it is to be understood that one or more of the integrated circuit packaging system could be prepared at one time on a medium, which could be separated into individual or multiple integrated circuit package assemblies at a later stage of fabrication.

Referring now to FIG. 1, therein is shown a partial top view of an integrated circuit packaging system 100 in a first embodiment of the present invention.

Generally, the integrated circuit packaging system 100 may include a substrate 102, a device 104, a bond pad 106, an interconnection 108, a bond wire pad row 110, a bond wire pad group 112, and a bond wire pad 114.

In at least one embodiment, the substrate 102 may include a carrier substrate, a semiconductor substrate, or a multi-layer structure (e.g., a laminate with one or more conductive layers separated by an insulator) suitable for electrically interconnecting integrated circuit systems, such as the device 104, formed on or above the substrate 102 to external electrical circuits via the bond wire pads 114. In other embodiments, the substrate 102 may include a thin metal sheet (e.g., a leadframe) or a conductive plated pattern on plastic tape suitable for electrically interconnecting integrated circuit systems formed on or above the substrate 102 to external electrical circuits via the bond wire pads 114. In yet other embodiments, the substrate 102 may include a conductive leadframe base with built-up plated leads, such as the bond wire pads 114. Once molded, the leadframe base can be removed (e.g., by etching), leaving the molded body and the plated leads remaining.

However, it is to be understood that the substrate 102 is not limited to these examples. In accordance with the invention, the substrate 102 may include any electrical interconnection structure that facilitates the incorporation of the integrated circuit packaging system 100 into a higher-level assembly, such as a printed circuit board or other suitable structure for supporting and/or electrically interfacing with the integrated circuit packaging system 100.

Formed over and/or on the substrate 102 is the device 104. The device 104 can be attached to the substrate 102 by techniques well known within the art and not described herein.

Generally, the device 104 may include one or more active devices, passive devices, or a combination thereof, vertically stacked or located within the same plane. By way of example, and not by way of limitation, the device 104 may include one or more semiconductor chips or die that transmit, receive, modulate and/or alter electrical signals, such as stacked devices, modular devices, ASIC devices, memory devices, RF devices, analog devices or a combination thereof. In other embodiments, the device 104 may further include, by way of example and not by way of limitation, one or more integrated circuit packages that transmit, receive, modulate and/or alter electrical signals, such as leaded and non-leaded packages, internal stacking module packages, flip-chip packages, modular packages, application-specific-integrated-circuit (ASIC) packages, RF packages, analog packages, memory packages, stacked die packages or a combination thereof. Additionally, the device 104 may also include a pre-molded configuration.

Furthermore, it is to be understood that the device 104 may also include Package-in-Package (PiP) and Package-on-Package (PoP) configurations. The PiP system is a three-dimensional (3D) package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board mount process.

As such, it is to be understood that the device 104 covers a wide range of semiconductor chip and integrated circuit package configurations involving various sizes, dimensions, and functional applications, and the type of chip or package configuration employed should only be limited by the design specifications of the integrated circuit package.

Moreover, it will be appreciated by those skilled in the art that the present embodiments permit the testing of the device 104 before adhering it to the substrate 102, thereby ensuring the use of known good die or packages in the manufacturing process. Additionally, after completing the integrated circuit packaging system 100, this assembly can also be tested before incorporation into additional package systems. This ensures that the final product includes known good assemblies, thereby improving the manufacturing process yield for the integrated circuit packaging system 100.

The device 104 may include the bond pad 106 located along and/or on a periphery of the device 104; however, it is to be understood that the bond pad 106 is not limited to these locations and may be located elsewhere. It will be appreciated by those skilled in the art that the bond pad 106 provides an electrical connection point between the device 104 and external electrical circuits.

Generally, the device 104 can be electrically connected to the bond wire pad row 110, or more specifically the bond wire pad 114, by the interconnection 108, which may include a bond wire. The interconnection 108 can be deposited using materials and techniques well known within the art and is currently only limited by the technology of wire bond equipment and the minimum required operating space for such equipment. Generally, the interconnection 108 can be located around one or more sides along the periphery of the device 104, thereby permitting various stacking configurations (e.g., offset stacking), which may permit more products to meet the specified design requirements of the integrated circuit packaging system 100.

The bond wire pad row 110 can be formed between a perimeter of the substrate 102 and the device 104; however, it is to be understood that the bond wire pad row 110 can be located elsewhere, such as on the perimeter of the substrate 102 to form a single or dual row quad-flat no-lead device or package, for example. It is to be understood that the integrated circuit packaging system 100 may utilize one or more of the bond wire pad row 110 on one or more sides of the device 104 as required by the design specifications for the package.

Generally, the bond wire pad row 110 may include one or more of the bond wire pads 114 disposed adjacent to one another in a modified single row configuration. In at least one embodiment, the bond wire pad row 110 can be described as rectangular formation whose boundary is defined by the outer perimeters of the bond wire pads 114. In such cases, each of the bond wire pad row 110 can be oriented with its long side (i.e., a major axis 120) substantially parallel to a side of the device 104; however, other orientations are possible. It is to be understood that each of the bond wire pad row 110 can be longer than, shorter than, or substantially equal to the length of each side of the device 104 depending upon the design specifications of the integrated circuit packaging system 100.

In some embodiments, the bond wire pad row 110 may include one or more of the bond wire pad groups 112 formed adjacent to each other, wherein the bond wire pad groups 112 each include two of the bond wire pads 114. In such cases, the bond wire pad groups 112 may include three sided shapes, e.g., right triangles whose hypotenuse sides are adjacent, that are chiral. In other cases, the bond wire pad groups 112 may more generally include rectilinear shapes (such as polygons) or curvilinear shapes (such as ovals and circles) that are mirror images. In yet other cases, the bond wire pads 114 can be shaped, sized, and/or oriented such that each of the bond wire pads 114 closely conforms to the shape of the contact footprint required by the interconnection 108. The bond wire pads 114 can also be formed of a uniform size or of varying sizes.

It is to be understood that the embodiments described herein may also utilize the flexibility of lead plating to form the bond wire pads 114. It will be appreciated by those skilled in the art that a lead plating process permits the bond wire pads 114 to be of any shape and position, thereby allowing the designer to make use of efficient (e.g., space minimizing) geometry patterns and/or configurations.

Additionally, in all such cases, a safety zone can be formed around the bond wire pads 114. The safety zone allows for some (predetermined) error in placement of the interconnection 108, allows for some error in the approach angle, while also permitting some variation in the shape or size of the contact footprint.

Regardless of the shape employed for the bond wire pads 114, the present embodiments create a configuration of the bond wire pads 114 that provides easier access to each of the bond wire pads 114, which helps to prevent common wire bonding problems, such as crossed wires and difficult access.

It is to be understood that in at least one embodiment, the bond wire pads 114 within each of the bond wire pad groups 112 can be connected to a single lead or conductive channel. In other embodiments, each of the bond wire pads 114 within each of the bond wire pad groups 112 can each be connected to their own separate lead or conductive channel. In yet other embodiments, the bond wire pad row 110 may include some of the bond wire pad groups 112 connected to a single lead or conductive channel and some of the bond wire pad groups 112 connected to more than one lead or conductive channel.

Generally, the bond wire pads 114 can be arranged such that a minimum distance 116 is maintained between each of the bond wire pads 114 within the bond wire pad row 110. The term "minimum distance" 116 as used herein is defined as the minimum spacing required for the technology node between adjacent ones of the bond wire pads 114 to prevent electrical interference. Stated another way, the bond wire pads 114 can be formed so as not to be in contact. However, it is to be understood that the spacing or distance between adjacent ones of the bond wire pads 114 can be increased to improve the reliability of the electrical interconnections if desired.

Generally, the bond wire pads 114 can be configured such that adjacent ones of the bond wire pads 114 within the bond wire pad groups 112 horizontally overlap, i.e., one of the bond wire pads 114 within the bond wire pad group 112 extends over or past and covers a part of an adjacent one of the bond wire pads 114 within the bond wire pad group 112 when viewed along the major axis 120 from the horizontal plane of the substrate 102. For purposes of illustration, the bond wire pads 114 can be described as horizontally overlapping when the viewing plane of an observer occurs along an arrow 122. Stated another way, from a top view orientation, the bond wire pads 114 can also be described as diagonally split.

In some embodiments, the bond wire pads 114 can horizontally overlap by about five percent to about one hundred percent to maximize density while minimizing the area consumed by the bond wire pad row 110. By way of example, and for purposes of illustration, the amount of horizontal overlap between the bond wire pads 114 can be generally depicted by a hatched region 124.

Furthermore, by way of example, it is to be understood that when each of the bond wire pad groups 112 horizontally overlaps by one hundred percent that the bond wire pad row 110 can possess a width "w" 118 that is substantially equivalent to a width of one of the bond wire pads 114. In such cases, the width of the bond wire pad row 110 can be minimized, thereby reducing the length of the interconnections 108. This can be beneficial when radio frequency (RF) signals are carried between the device 104 and the bond wire pads 114 because long wires carrying RF signals can cause electromagnetic interference with nearby wires or circuitry. In other embodiments, when each of the bond wire pad groups 112 horizontally overlaps by less than one hundred percent, it is to be understood that the width "w" 118 of the bond wire pad row 110 will increase correspondingly.

In some embodiments, the bond wire pad groups 112 may all horizontally overlap by the same amount. In other embodiments, the amount of horizontal overlap may vary between the bond wire pad groups 112 to accommodate specific electrical contact patterns. In yet other embodiments, the amount of horizontal overlap may vary between each of the bond wire pads 114.

However, regardless of the arrangement chosen for the bond wire pads 114, the present embodiments permit a denser pitch while maintaining a relatively large bonding area on the bond wire pads 114. For example, by arranging the bond wire pads 114 in an offset and/or staggered adjacent mirror image pair, the distance between the bonding centers of the bond wire pads 114 can be optimized.

Notably, the configurations described herein result in a higher I/O lead density, when compared to conventional single or dual row linear or staggered arrangements of pads.

It is to be understood that after forming the interconnections 108 that an encapsulation material (not shown) can be deposited over and/or around the integrated circuit packaging system 100 by processes and techniques well known in the art and not disclosed herein.

Accordingly, it has been discovered that that the present embodiments enable the formation of the integrated circuit packaging system 100 with increased I/O capability by forming the bond wire pads 114 with efficient geometry patterning.

Additionally, it has been discovered that that the present embodiments enable the formation of the integrated circuit packaging system 100 with increased I/O capability by forming the bond wire pads 114 without occupying more space in the package (e.g., by forming them as closely spaced mirror image patterns).

It has been unexpectedly found that the embodiments disclosed herein help to eliminate the difficult wire access problems associated with multiple row bump chip carrier (BCC) type packages.

It has been unexpectedly found that the embodiments disclosed herein help to eliminate the difficult wire access problems, such as wire crossing, associated with conventional lead layouts.

Moreover, it has been unexpectedly found that the embodiments disclosed herein help to eliminate the small contact areas of conventional dual row leads that occupy more substrate space than the presently disclosed embodiments.

Thus, it has been discovered that the integrated circuit packaging system 100 of the present embodiments furnishes important and heretofore unknown and unavailable solutions, capabilities, and functional aspects for increasing the I/O density while minimizing wire problems associated with increased lead densities.

Figure 2:
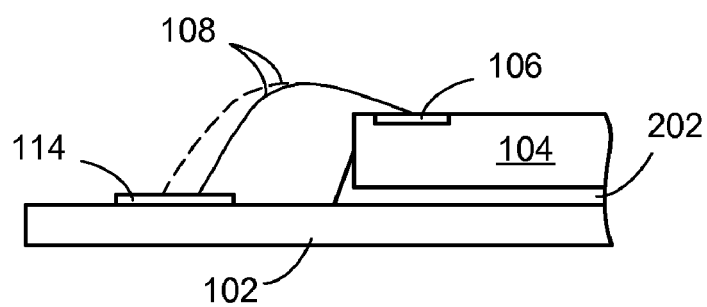
FIG. 2 is a partial side view of an integrated circuit packaging system in an embodiment of the present invention.

Referring now to FIG. 2, therein is shown a partial side view of an integrated circuit packaging system 100, of FIG. 1, in an embodiment of the present invention.

The integrated circuit packaging system 100 includes the substrate 102, the device 104, the bond pad 106, the interconnection 108, the bond wire pad 114, and an adhesive 202. Generally, the adhesive 202 may include thermally conductive or non-conductive properties, electromagnetic interference properties, and/or insulative type properties depending on design requirements. In at least one embodiment, the adhesive 202 may utilize zero fillet technology to minimize the footprint of the integrated circuit packaging system 100.

Figure 3:
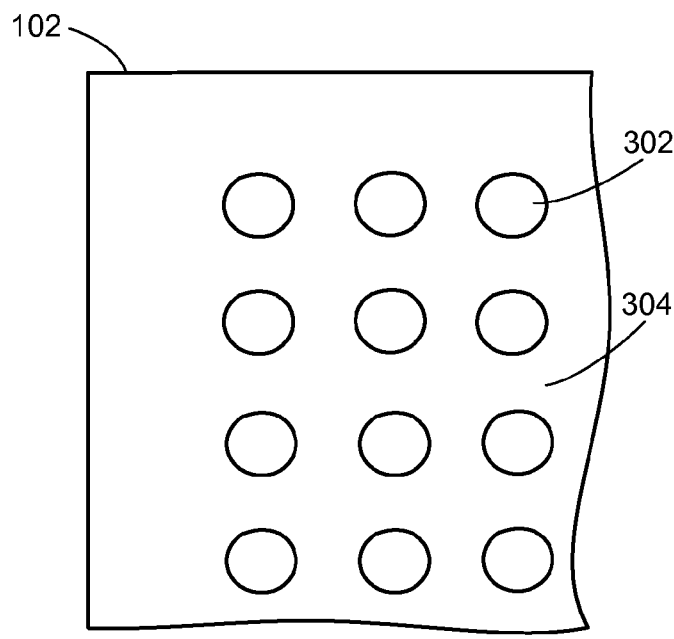
FIG. 3 is a partial bottom view of an integrated circuit packaging system in an embodiment of the present invention.

Referring now to FIG. 3, therein is shown a partial bottom view of an integrated circuit packaging system 100, of FIG. 1, in an embodiment of the present invention.

Per this view, the substrate 102 and an interconnect pad 302 of the integrated circuit packaging system 100 are depicted. The interconnect pad 302 may include any interface connection technology that establishes electrical contact between the integrated circuit packaging system 100 (via the bond wire pads 114) and external electrical circuits.

It is to be understood that more than one of the interconnect pad 302 can be arranged to include a random and/or uniform configuration located on, adjacent, or inward of the periphery of the substrate 102. The design, configuration and/or pattern of the interconnect pads 302 is only to be limited by the technology node pitch and/or spacing requirements for electrical contacts.

It will be appreciated by those skilled in the art that the interconnect pads 302 can be electrically connected to the bond wire pads 114 (not shown) by conductive channels formed within the substrate 102 and/or by conductive traces (not shown) formed on a bottom surface 304 of the substrate 102.

Is to be understood that the interconnect pads 302 are not limited to the shapes depicted and may include any curvilinear or rectilinear shape as required by the design specifications.

Additionally, it is to be understood that the interconnect pads 302 are not limited to the leadless structures shown, but may also include leaded structures, such as pins or solder balls.

Figure 4:
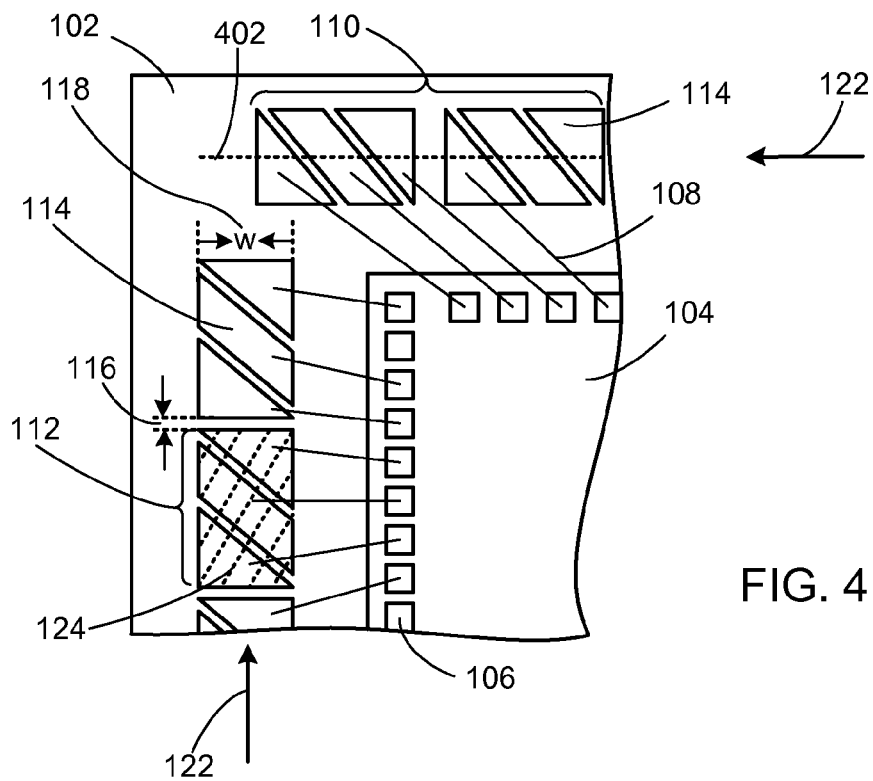
FIG. 4 is a partial top view of an integrated circuit packaging system in a second embodiment of the present invention.
Figure 5:
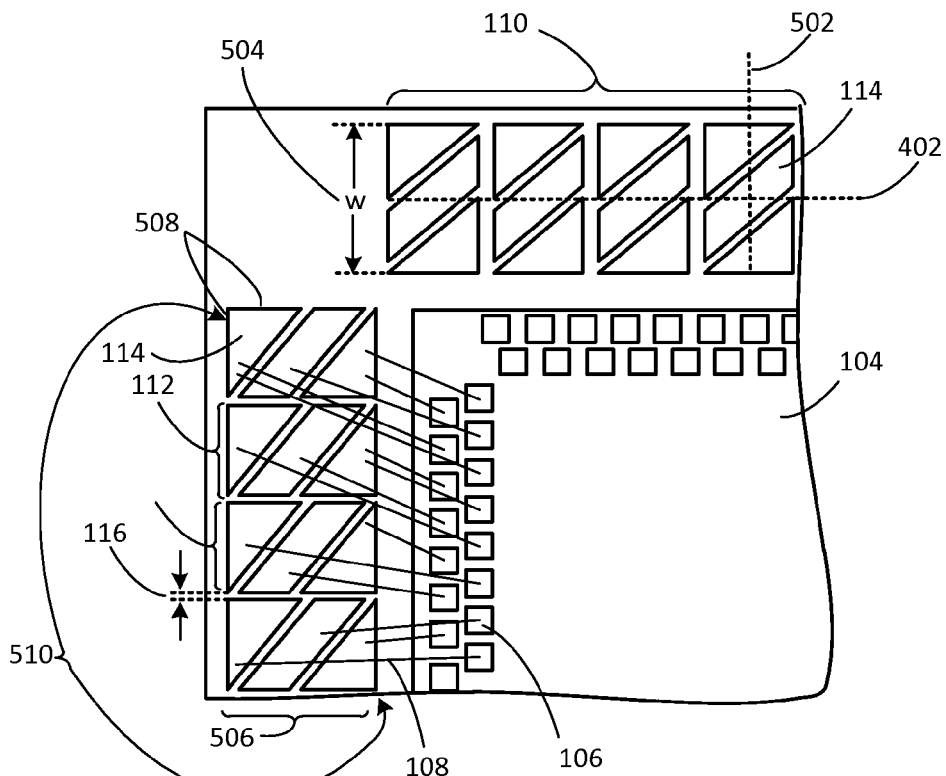
FIG. 5 is a partial top view of an integrated circuit packaging system in a third embodiment of the present invention.

Referring now to FIGS. 4 and 5. FIGS. 4 and 5 include some of the same reference numbers and nomenclature used to describe the integrated circuit packaging system 100 in FIGS. 1-3 and the process steps of FIGS. 1-3. It is noted that the elements, devices, packages, configurations, and process steps corresponding to such reference numbers and nomenclature generally include the same characteristics (e.g., function, purpose, process techniques, etc.) as those described in reference to FIGS. 1-3 and, therefore, their descriptions are not reiterated in detail for FIGS. 4 and 5. Rather the descriptions of the elements, devices, packages, configurations, and process steps corresponding to reference numbers in FIGS. 1-3 are incorporated for the same reference numbers included in FIGS. 4-5.

Referring now to FIG. 4, therein is shown a partial top view of an integrated circuit packaging system 100, in a second embodiment of the present invention.

The integrated circuit packaging system 100 may include the substrate 102, the device 104, the bond pad 106, the interconnection 108, the bond wire pad row 110, the bond wire pad groups 112, the bond wire pads 114, the minimum distance 116, and the width "w" 118. It is to be understood that the substrate 102, the device 104, the bond pad 106, the interconnection 108, the bond wire pad row 110, the bond wire pad groups 112, the bond wire pads 114, the minimum distance 116, and the width "w" 118 may include any of the characteristics, such as material composition, shape, dimensions, and process techniques, described above in regard to FIG. 1.

However, the bond wire pad groups 112 of the current embodiments differ by forming the bond wire pad groups 112 to include three of the bond wire pads 114. In such cases, the bond wire pad groups 112 may include two chiral three sided shapes, such as right triangles whose hypotenuse sides are separated by a four sided shape, such as a parallelogram. Generally, in these cases, each of the bond wire pad groups 112 can be described as a repeating sequence of a three sided bond wire pad 114, a four sided bond wire pad 114, and a three sided bond wire pad 114.

In other cases, the bond wire pad groups 112 may more generally include a pair of rectilinear shapes (such as polygons) or curvilinear shapes (such as ovals and circles) that are mirror images, wherein these mirror image shapes are separated by another rectilinear shape or curvilinear shape formed therebetween. In yet other cases, the bond wire pads 114 can be shaped, sized, and/or oriented such that each of the bond wire pads 114 closely conforms to the shape of the contact footprint required by the interconnection 108. It is to be understood that the bond wire pads 114 can be formed of a uniform size or of varying sizes.

Per these embodiments, a major axis 402 for each of the bond wire pad row 110 and the bond wire pad groups 112 can be substantially parallel and/or the same for both.

Regardless of the shape employed for the bond wire pads 114, the present embodiments create a configuration of the bond wire pads 114 that provides easier access to each of the bond wire pads 114, which helps to prevent common wire bonding problems, such as crossed wires and difficult access.

It is to be understood that in at least one embodiment, the bond wire pads 114 within each of the bond wire pad groups 112 can be connected to a single lead or conductive channel. In other embodiments, each of the bond wire pads 114 within each of the bond wire pad groups 112 can each be connected to their own separate lead or conductive channel. In yet other embodiments, the bond wire pad row 110 may include some of the bond wire pad groups 112 connected to a single lead or conductive channel and some of the bond wire pad groups 112 connected to more than one lead or conductive channel.

In at least one embodiment, the bond wire pads 114 can be arranged such that the minimum distance 116 can be maintained between each of the bond wire pads 114 within the bond wire pad row 110. However, it is to be understood that the spacing or distance between adjacent bond wire pads 114 can be increased to improve the reliability of the electrical interconnections if desired.

Generally, the bond wire pads 114 can be configured such that adjacent ones of the bond wire pads 114 within the bond wire pad groups 112 horizontally overlap, i.e., one of the bond wire pads 114 within the bond wire pad group 112 extends over or past and covers a part of an adjacent one of the bond wire pads 114 within the bond wire pad group 112 when viewed along the major axis 402 from the horizontal plane of the substrate 102. For purposes of illustration, the bond wire pads 114 can be described as horizontally overlapping when the viewing plane of an observer occurs along the arrow 122. Stated another way, from a top view orientation, the bond wire pads 114 can also be described as diagonally split.

In some embodiments, the bond wire pads 114 can horizontally overlap by about five percent to about one hundred percent to maximize density while minimizing the area consumed by the bond wire pad row 110. By way of example, and for purposes of illustration, the amount of horizontal overlap between the bond wire pads 114 can be generally depicted by the hatched region 124.

By way of example, it is to be understood that when each of the bond wire pad groups 112 horizontally overlaps by one hundred percent (e.g., when viewed along the major axis 402) that the bond wire pad row 110 can possess the width "w" 118 that is substantially equivalent to a width of one of the bond wire pads 114. In such cases, the width of the bond wire pad row 110 can be minimized, thereby reducing the length of the interconnections 108. This can be beneficial when radio frequency (RF) signals are carried between the device 104 and the bond wire pads 114 because long wires carrying RF signals can cause electromagnetic interference with nearby wires or circuitry. In other embodiments, when each of the bond wire pad groups 112 horizontally overlaps by less than one hundred percent, it is to be understood that the width "w" 118 of the bond wire pad row 110 will increase correspondingly.

In some embodiments, the bond wire pad groups 112 may all horizontally overlap by the same amount. In other embodiments, the amount of horizontal overlap may vary between the bond wire pad groups 112 to accommodate specific electrical contact patterns. In yet other embodiments, the amount of horizontal overlap may vary between each of the bond wire pads 114.

However, regardless of the arrangement chosen for the bond wire pads 114, the present embodiments permit a denser pitch while maintaining a relatively large bonding area on the bond wire pads 114. For example, by arranging the bond wire pads 114 in an offset and/or staggered adjacent configuration, the distance between the bonding centers of the bond wire pads 114 can be optimized.

Notably, the configurations described herein result in a higher I/O lead density, when compared to conventional single or dual row linear or staggered arrangements of pads.

It is to be understood that after forming the interconnection 108 that an encapsulation material (not shown) can be deposited over and/or around the integrated circuit packaging system 100 by processes and techniques well known in the art and not described herein.

Referring now to FIG. 5, therein is shown a partial top view of an integrated circuit packaging system 100, in a third embodiment of the present invention.

FIG. 5 depicts a similar configuration as to that shown in FIG. 4, and consequently, only the differences between the figures will be described, to avoid redundancy.

Per this embodiment, a major axis 502 of the bond wire pad groups 112 is perpendicular or substantially perpendicular to the major axis 402 of the bond wire pad row 110 and to the side of the device 104. Stated another way, each of the bond wire pad groups 112 has been rotated ninety degrees from the bond wire pad groups 112, of FIG. 4, to further maximize the density of the bond wire pads 114. Accordingly, the number of the bond pads 106 formed on the device 104 can be increased (e.g., by forming a dual row configuration of the bond pads 106), thereby further increasing the density of electrical connection points to the device 104. Notably, this embodiment can also help to prevent difficult wire access and the crossing of wires during formation of the interconnections 108.

The bond wire pads 114 can be separated by the minimum distance 116 and a width 504 can be defined as the cross section of the bond wire pad group 112 that traverses all three of the bond wire pads 114 within the bond wire pad group 112. The bond wire pad row 110 can be described as a rectangular formation 506 bounded by outer sides 508 of the bond wire pads 114 at opposing corners 510 of the bond wire pad row 110.

Figure 6:
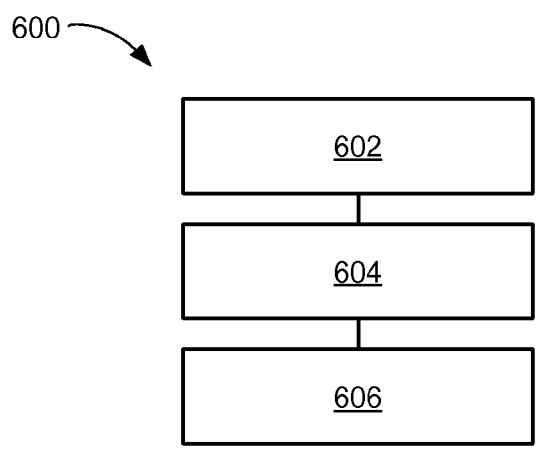
FIG. 6 is a flow chart of a method of manufacture of an integrated circuit packaging system in an embodiment of the present invention.

Referring now to FIG. 6, therein is shown a flow chart of a method 600 of manufacture of an integrated circuit packaging system 100 in an embodiment of the present invention. The method 600 includes: forming a device over a substrate including a bond wire pad row located between a perimeter of the substrate and the device in a block 602; configuring the bond wire pad row to include three sided bond wire pads that horizontally overlap in a block 604; and forming an interconnection between the device and the bond wire pad row in a block 606.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present embodiments thus have numerous aspects. One such aspect is that the present embodiments enable the formation of the integrated circuit packaging system with increased I/O capability by forming the bond wire pads with efficient geometry patterning.

Another aspect is that the present embodiments enable easier wire access by using efficient geometry patterns to form the bond wire pads.

Another aspect is that the present embodiments enable a larger contact area for a bond wire pad without occupying more space in the package.

Another aspect is that the present embodiments enable the formation of the integrated circuit packaging system with increased I/O capability while reducing the likelihood of crossing wires during formation of wire bonds to the bond wire pads.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a device over a substrate including a bond wire pad row located between a perimeter of the substrate and the device;
    configuring the bond wire pad row to include three sided bond wire pads with the bond wire pad row in a rectangular formation bounded by outer sides of the three sided bond wire pads at opposing corners of the bond wire pad row; and
    forming an interconnection between the device and the bond wire pad row.

2. The method as claimed in claim 1 further comprising:
    forming a bond wire pad group within the bond wire pad row to include two of the three sided bond wire pads formed as mirror images.

3. The method as claimed in claim 1 further comprising:
    configuring each of the three sided bond wire pads to be substantially equally spaced from each other on two sides.

4. The method as claimed in claim 1 further comprising:
    configuring each of the three sided bond wire pads to include right triangles.

5. The method as claimed in claim 1 further comprising:
    configuring the three sided bond wire pads to horizontally overlap by at least five percent.

6. A method of manufacture of an integrated circuit packaging system comprising:
    forming a device over a substrate including a bond wire pad row located between a perimeter of the substrate and the device;
    configuring the bond wire pad row to include three sided bond wire pads and four sided bond wire pads with the bond wire pad row in a rectangular formation bounded by outer sides of the three sided bond wire pads at opposing corners of the bond wire pad row; and
    forming an interconnection between the device and the bond wire pad row.

7. The method as claimed in claim 6 further comprising:
    configuring the bond wire pad row with a repeating sequence including the three sided bond wire pad, the four sided bond wire pad, and another of the three sided bond wire pad.

8. The method as claimed in claim 6 further comprising:
    forming a bond wire pad group within the bond wire pad row, the bond wire pad group configured to include two of the three sided bond wire pads separated by one of the four sided bond wire pads.

9. The method as claimed in claim 6 further comprising:
    configuring the bond wire pad row to include a bond wire pad group with two right triangles separated by a parallelogram.

10. The method as claimed in claim 6 further comprising:
    configuring the bond wire pad row to include a bond wire pad group with a major axis substantially parallel or orthogonal to the major axis of the bond wire pad row.

11. An integrated circuit packaging system comprising:
    a device over a substrate including a bond wire pad row located between a perimeter of the substrate and the device, the bond wire pad row configured to include three sided bond wire pads with the bond wire pad row in a rectangular formation bounded by outer sides of the three sided bond wire pads at opposing corners of the bond wire pad row; and
    an interconnection between the device and the bond wire pad row.

12. The system as claimed in claim 11 further comprising:
    a bond wire pad group within the bond wire pad row including two of the three sided bond wire pads formed as mirror images.

13. The system as claimed in claim 11 wherein:
    the three sided bond wire pads are configured to be substantially equally spaced from each other on two sides.

14. The system as claimed in claim 11 wherein:
    the three sided bond wire pads include right triangles.

15. The system as claimed in claim 11 wherein:
    the three sided bond wire pads horizontally overlap by at least five percent.

16. The system as claimed in claim 11 further comprising:
    a four sided bond wire pad within the bond wire pad row horizontally overlapping the three sided bond wire pads.

17. The system as claimed in claim 16 wherein:
    the bond wire pad row is configured with a repeating sequence including the three sided bond wire pad, the four sided bond wire pad, and another of the three sided bond wire pad.

18. The system as claimed in claim 16 wherein:
    the bond wire pad row includes a bond wire pad group with two of the three sided bond wire pads separated by one of the four sided bond wire pads.

19. The system as claimed in claim 16 wherein:
    the bond wire pad row includes two right triangles separated by a parallelogram.

20. The system as claimed in claim 16 wherein:
    the bond wire pad row is configured to include a bond wire pad group with a major axis substantially parallel or orthogonal to the major axis of the bond wire pad row.

* * * * *